(12) United States Patent
Hung et al.

(10) Patent No.: US 12,048,109 B2
(45) Date of Patent: Jul. 23, 2024

(54) SHOCK-PROOF CABINET

(71) Applicant: Fulian Precision Electronics (Tianjin) Co., LTD., Tianjin (CN)

(72) Inventors: Kuo-Chih Hung, New Taipei (TW); Hung-Liang Chung, New Taipei (TW); Hao-Wen Cheng, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 245 days.

(21) Appl. No.: 17/719,503

(22) Filed: Apr. 13, 2022

(65) Prior Publication Data

US 2022/0386489 A1 Dec. 1, 2022

(30) Foreign Application Priority Data

May 25, 2021 (CN) .......................... 202110570471.6

(51) Int. Cl.
*H05K 5/02* (2006.01)
*H05K 7/18* (2006.01)

(52) U.S. Cl.
CPC ............. *H05K 5/0234* (2013.01); *H05K 7/18* (2013.01)

(58) Field of Classification Search
CPC ............................... H05K 5/0234; H05K 7/18
USPC ....................................................... 312/351.1
See application file for complete search history.

(56) References Cited

U.S. PATENT DOCUMENTS

| | | | | |
|---|---|---|---|---|
| 4,754,948 A | * | 7/1988 | Casciani | A47B 95/00 248/500 |
| 7,455,373 B2 | * | 11/2008 | Bender | B23K 9/32 248/500 |
| 2001/0015600 A1 | * | 8/2001 | Duong | H02B 1/303 248/500 |
| 2004/0263035 A1 | * | 12/2004 | Lim | F25D 23/00 312/351.1 |

FOREIGN PATENT DOCUMENTS

| CN | 209462768 U | 10/2019 |
|---|---|---|
| CN | 211629680 U | 10/2020 |

* cited by examiner

*Primary Examiner* — James O Hansen
(74) *Attorney, Agent, or Firm* — ScienBiziP, P.C.

(57) ABSTRACT

A cabinet for electronic components, which is resistant to shocks resulting in deformation of a housing and unsteady leaning of a cabinet casing, includes a cabinet body, a plurality of supporting units, and a plurality of shock-proof units. The plurality of supporting units is disposed on a bottom portion of the cabinet body, and each of the plurality of shock-proof units includes a shock-proof member and a carrier. An end of the shock-proof member rests on the floor or ground, and the other end is connected to the cabinet body. The carrier is connected to the cabinet body and supports the cabinet body, inclination of the cabinet body following heavy jarring and impacts is prevented.

10 Claims, 5 Drawing Sheets

SHOCK-PROOF CABINET

FIELD

The subject matter relates to electrical devices, and more particularly, to a shock-proof cabinet.

BACKGROUND

During process of assembling an electrical cabinet, such as a cabinet of data center, an outdoor cabinet of 5G communication base station, or a power cabinet, adjustable feet are installed at the bottom of the cabinet to prevent wheels of the cabinet from moving. Then a shock-proof plate is disposed on the bottom of the cabinet in completing the assembly of the cabinet.

However, in the event of heavy jarring such as the cabinet being lifted and dropped a few centimeters, stress concentration will occur at a connection portion between the adjustable feet and the cabinet, causing deformation or damage at the bottom of the cabinet. This may deform the cabinet and leave it vulnerable to leaning, perhaps even falling over in time. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
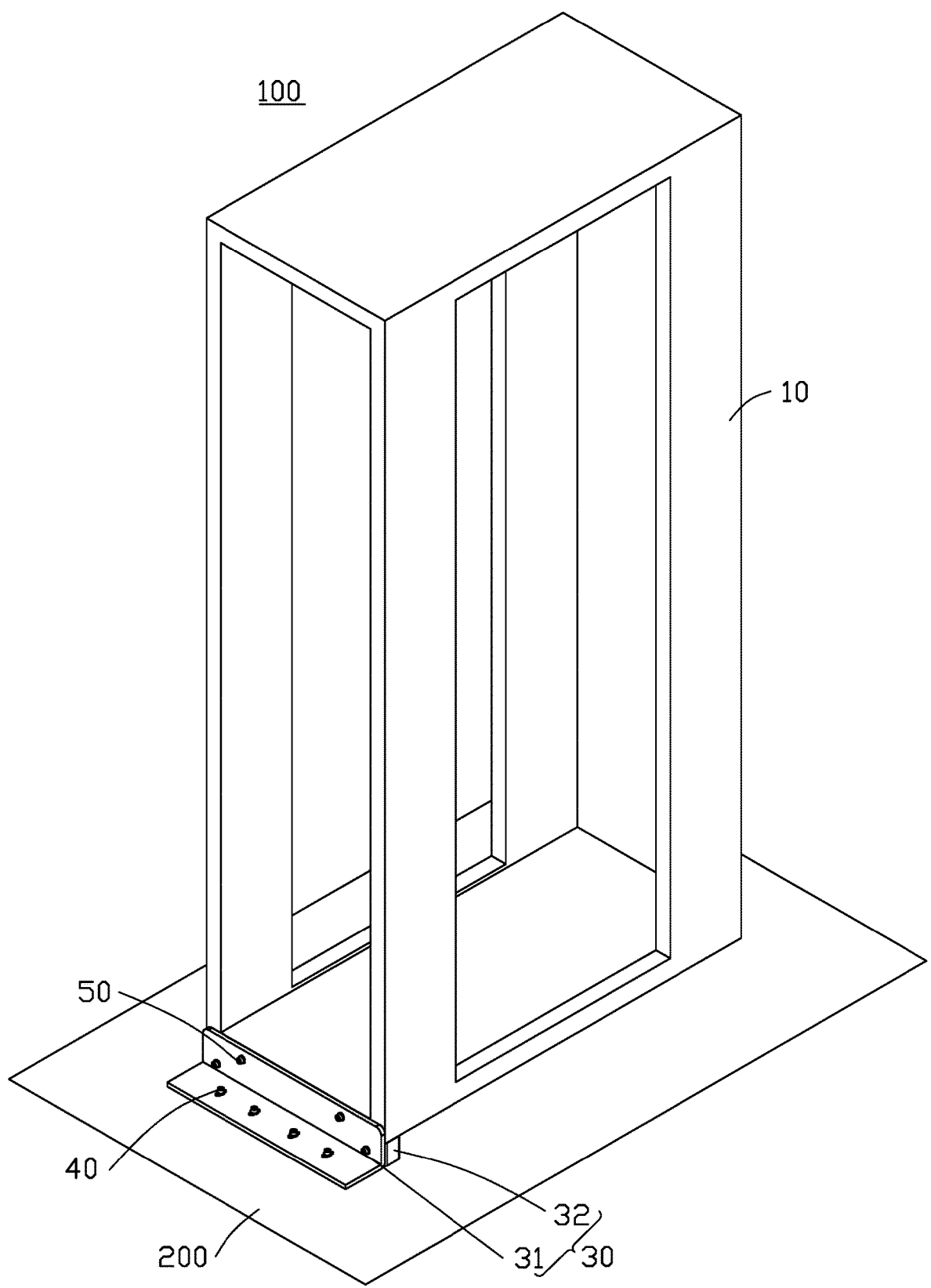
FIG. 1 is a diagrammatic view of a shock-proof cabinet according to the present disclosure.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant characteristic being described. Also, the description is not to be considered as limiting the scope of the embodiments described herein. The drawings are not necessarily to scale, and the proportions of certain parts may be exaggerated to better illustrate details and characteristics of the present disclosure.

The term "comprising," when utilized, means "including, but not necessarily limited to"; it specifically indicates open-ended inclusion or membership in the so-described combination, group, series, and the like.

Figure 2:
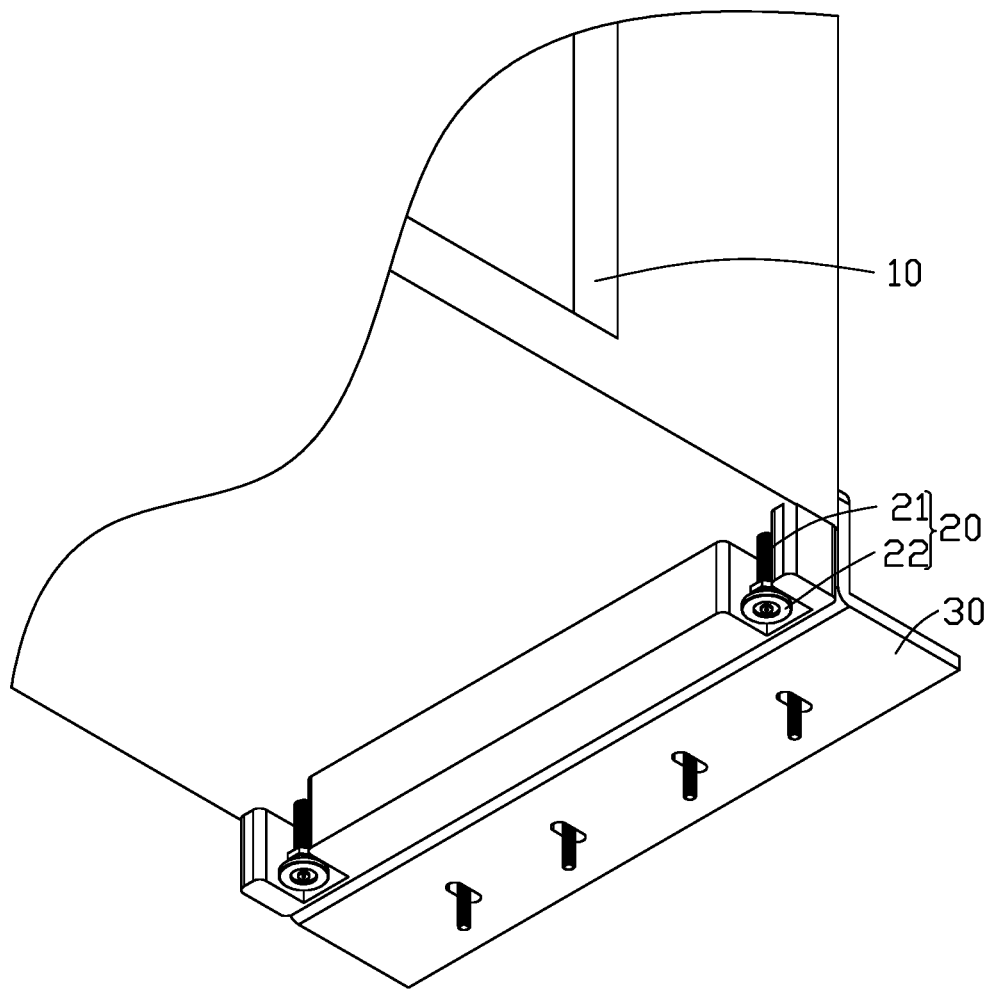
FIG. 2 is a diagrammatic view showing a bottom portion of the shock-proof cabinet of FIG. 1.

FIGS. 1 and 2 illustrate an embodiment of a shock-proof cabinet 100, which includes a cabinet body 10, a plurality of supporting units 20, and a plurality of shock-proof units 30. The supporting units 20 are disposed on a bottom portion of the cabinet body 10. The supporting units 20 are used to support and elevate the cabinet body 10. Each of the shock-proof units 30 is connected to a sidewall of the cabinet body 10. The shock-proof units 30 improve the shock-resisting properties of the cabinet body 10, and prevent leaning or any inclination of the cabinet body 10. In use, the shock-proof cabinet 100 includes two or more shock-proof units 30. The shock-proof units 30 are disposed on different sidewalls of the cabinet body 10.

The structure of the cabinet body 10 is as a frame. The cabinet body 10 is used to install or receive an external equipment therein. In an embodiment, the cabinet body 10 is a cabinet frame with power supplies to internal components.

Referring to FIG. 2, each supporting unit 20 is disposed on a corner of the bottom portion of the cabinet body 10. This keeps the cabinet body 10 a certain distance from a ground 200, and ensures good ventilation of the cabinet body 10, the bottom portion of the cabinet body 10 may also be cleaned more easily.

The supporting unit 20 includes a connecting member 21 and a supporting member 22. One end of the connecting member 21 is connected to the cabinet body 10, and the other end of the connecting member 21 is connected to one supporting member 22. One end of the supporting member 22 is connected to the connecting member 21, and the other end of the supporting member 22 is connected to the ground 200. The connecting member 21 is of a certain height, so as to increase the distance between the cabinet body 10 and the ground 200.

In an embodiment, the shock-proof cabinet 100 includes four supporting units 20, disposed on four corners of the cabinet body 10. In other embodiments, the number of the supporting units 20 may be three, five, six, or other numbers, which is not limited. The connecting member 21 and the corresponding supporting member 22 can be integrally formed. The connecting members 21 and the supporting members 22 elevate the cabinet body 10 and maintain stability of the cabinet body 10.

Figure 3:
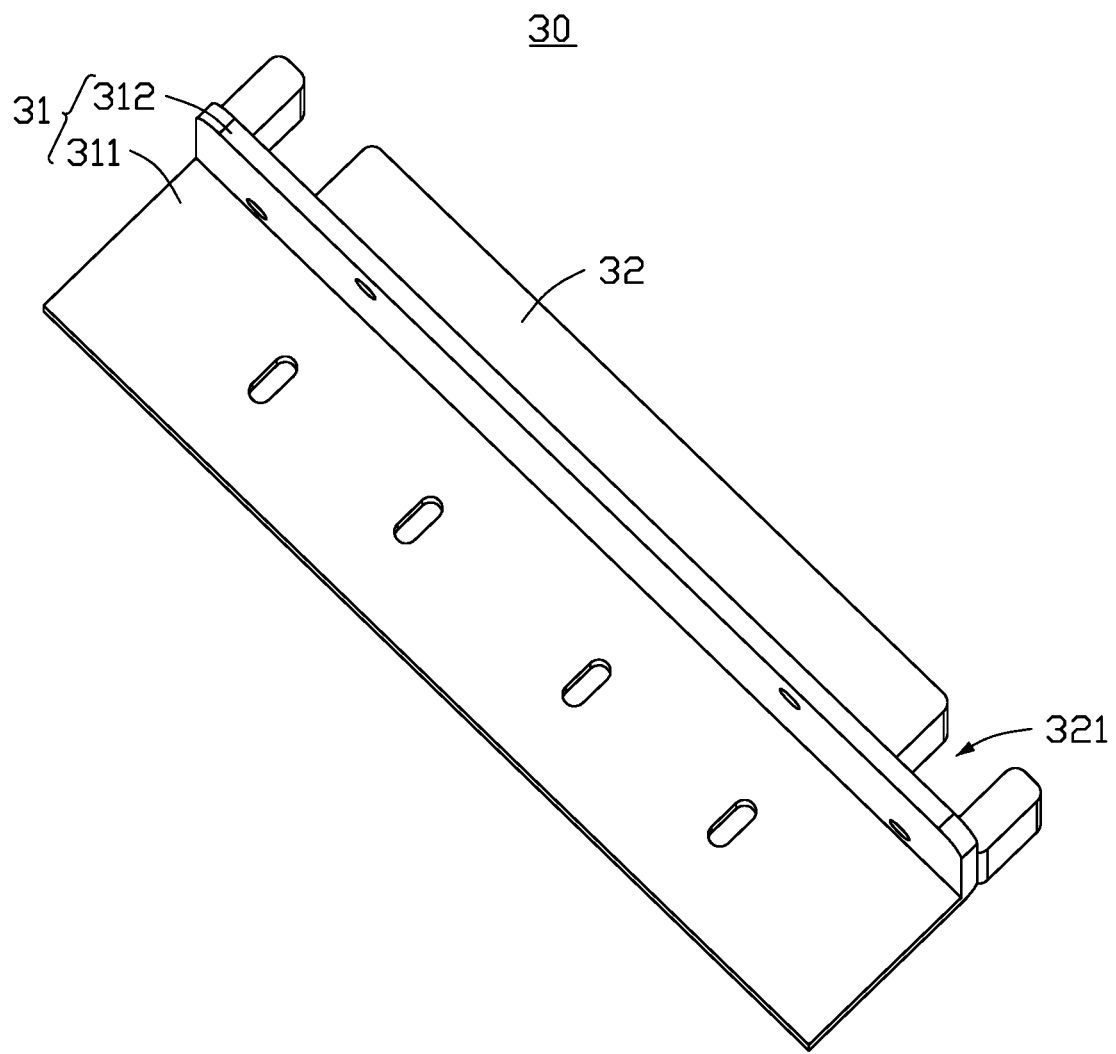
FIG. 3 is a diagrammatic view of a shock-proof unit of the shock-proof cabinet of FIG. 1.
Figure 4:
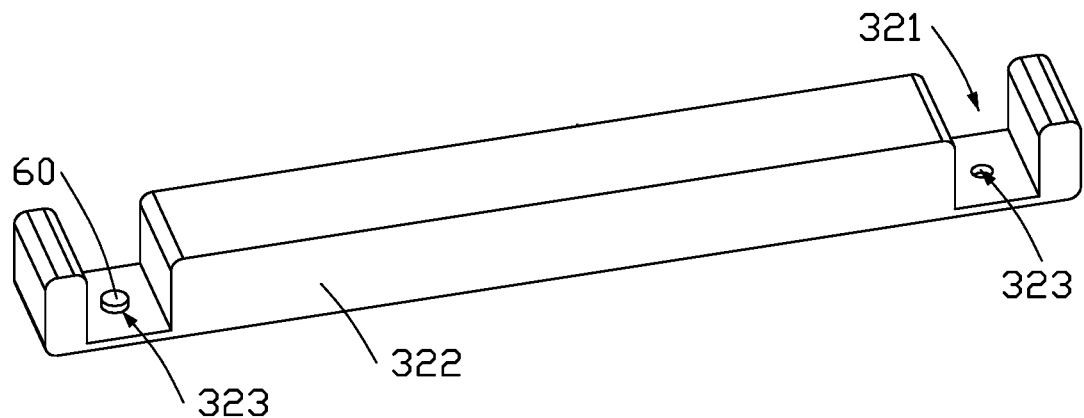
FIG. 4 is a diagrammatic view of a carrier of the shock-proof cabinet of FIG. 1.
Figure 5:
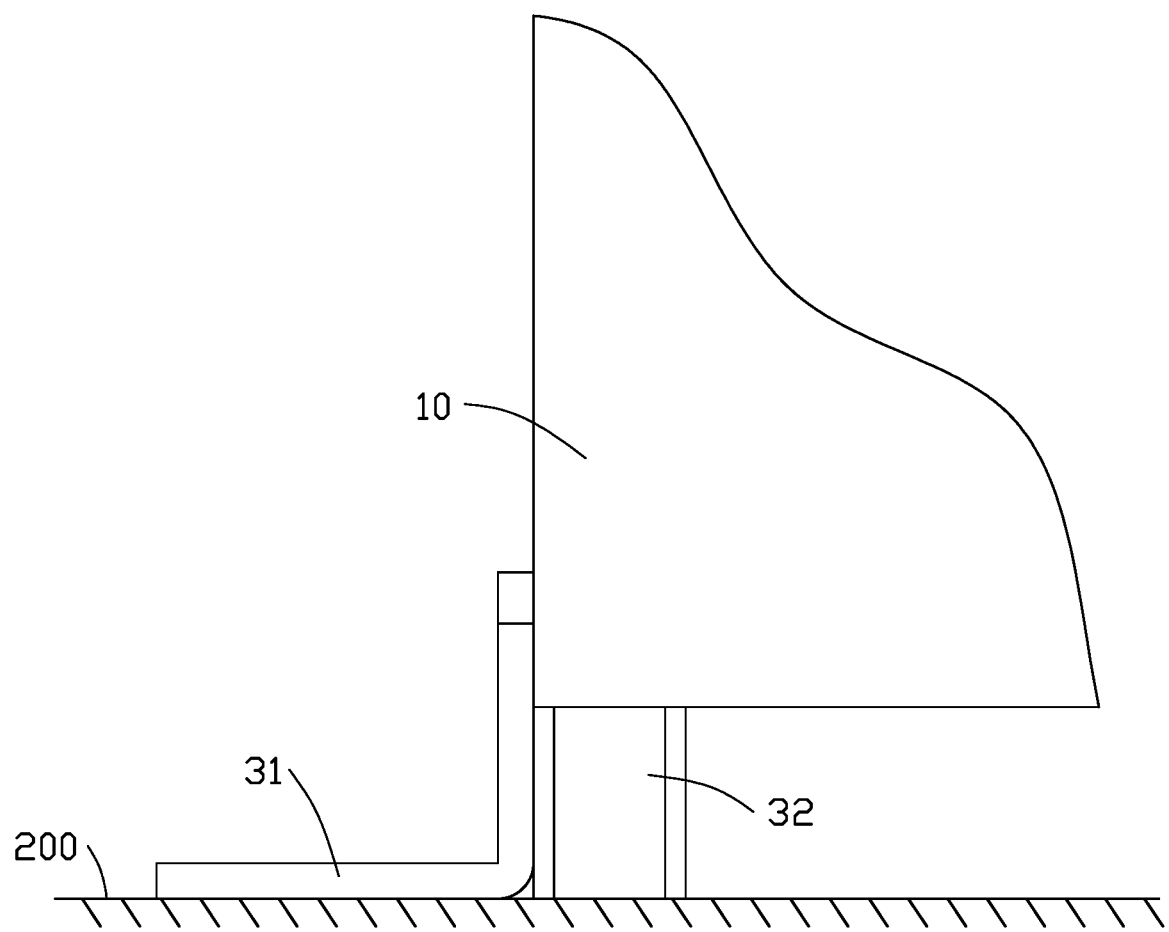
FIG. 5 is a cross-sectional view of the shock-proof cabinet of FIG. 1.

Referring to FIGS. 3, 4, and 5, the shock-proof unit 30 includes a shock-proof member 31 and a carrier 32. The carrier 32 is disposed on a sidewall of the shock-proof member 31. The shock-proof member 31 is fixed on the carrier 32. In an embodiment, the shock-proof member 31 includes a fixing plate 311 and a connecting plate 312. The fixing plate 311 is disposed on a side of the connecting plate 312 and is perpendicular to the connecting plate 312. The carrier 32 is disposed on the other side of the connecting plate 312 away from the fixing plate 311 and abuts against the connecting plate 312. The fixing plate 311 is connected to the ground 200. Along a height direction of the cabinet body 10, a height of the connecting plate 312 is not less than a height of the carrier 32. The connecting plate 312 is fixed on the cabinet body 10. In an embodiment, the fixing plate 311 is fixed on the ground 200 through screws 40, and the connecting plate 312 is also fixed on the cabinet body 10 by other screws 50. The fixing plate 311 and the ground 200 can also be fixed in other ways, not being limited.

The carrier 32 defines at least one mounting groove 321 at each end of the carrier 32. The connecting member 21 and the supporting member 22 pass through the mounting grooves 321 to abut the cabinet body 10 against the carrier 32.

Referring to FIG. 4, the carrier 32 further includes a carrying surface 322. The carrying surface 322 is parallel to the fixing plate 311. The carrying surface 322 abuts against the cabinet body 10 and allows the cabinet body 10 to be safely carried.

The carrier 32 defines a locking hole 323, in which a fixing member 60 is installed, to connect the carrier 32 to the connecting plate 312. In an embodiment, the fixing member 60 is a screw.

The carrier 32 can have other structure as long as the supporting unit 20 supports the cabinet body 10 against inclination.

During assembly of the shock-proof cabinet 100, the shock-proof members 31 and the carriers 32 are assembled together first. Then, the cabinet body 10 having the supporting units 20 is fixed on the carriers 32. Finally, the cabinet body 10 is connected to the shock-proof members 31.

With the above configuration, the cabinet body 10 is supported by the carriers 32, thereby preventing inclination of the cabinet body 10 and improving the shock-resisting properties of the shock-proof cabinet 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including, the full extent established by the broad general meaning of the terms used in the claims.

What is claimed is:

1. A shock-proof cabinet, comprising:
   a cabinet body;
   a plurality of supporting units disposed on a bottom portion of the cabinet body, the plurality of supporting units configured to support the cabinet body; and
   a plurality of shock-proof units disposed on different sidewalls of the cabinet body, wherein each of the plurality of shock-proof units comprises a shock-proof member and a carrier connected to the shock-proof member, an end of the shock-proof member is configured to connect to a ground, another end of the shock-proof member is connected to the sidewall of the cabinet body, the carrier abuts against the bottom portion of the cabinet body, and is configured to support the cabinet body; the shock-proof member comprises a fixing plate and a connecting plate, the fixing plate is perpendicular to the connecting plate, the fixing plate is configured to abut against the ground, and the connecting plate is connected to the carrier; the carrier defines a locking hole, the locking hole is configured to install a fixing member therein to connect the carrier to the connecting plate.

2. The shock-proof cabinet of claim 1, wherein along a height direction of the cabinet body, a height of the connecting plate is larger than a height of the carrier.

3. The shock-proof cabinet of claim 1, wherein the fixing plate is fixed on the ground by screws, and the connecting plate is fixed on the cabinet body by other screws.

4. The shock-proof cabinet of claim 1, wherein the carrier comprises a carrying surface parallel to the fixing plate, and the carrying surface is configured to abut against the cabinet body and configured to support the cabinet body.

5. The shock-proof cabinet of claim 1, wherein each of the plurality of supporting units comprises a connecting member and a supporting member, one end of the connecting member is connected to the cabinet body, another end of the connecting member is connected to the supporting member; one end of the supporting member away from the connecting member is connected to the ground.

6. The shock-proof cabinet of claim 5, wherein the connecting member and the supporting member are integrally formed.

7. The shock-proof cabinet of claim 5, wherein the carrier defines at least one mounting groove at each end of the carrier, the connecting member and the supporting member are installed in the at least one mounting groove.

8. The shock-proof cabinet of claim 1, wherein a structure of the cabinet body is as a frame.

9. The shock-proof cabinet of claim 1, wherein the plurality of supporting units comprises four supporting units, and the plurality of shock-proof units comprises four shock-proof units.

10. The shock-proof cabinet of claim 9, wherein the four supporting units are disposed on four corners of the bottom portion of the cabinet body, and the four shock-proof units are disposed on four sidewalls of the cabinet body.

* * * * *